United States Patent
Lee et al.

(10) Patent No.: US 11,258,417 B2
(45) Date of Patent: Feb. 22, 2022

(54) TECHNIQUES FOR USING COMPUTER VISION TO ALTER OPERATION OF SPEAKER(S) AND/OR MICROPHONE(S) OF DEVICE

(71) Applicant: Lenovo (Singapore) Pte. Ltd., Singapore (SG)

(72) Inventors: Jonathan Co Lee, Cary, NC (US); Matthew Manuel Davis, Durham, NC (US)

(73) Assignee: Lenovo (Singapore) Pte. Ltd., Singapore (SG)

( * ) Notice: Subject to any disclaimer, the term of this patent is extended or adjusted under 35 U.S.C. 154(b) by 311 days.

(21) Appl. No.: 16/588,163

(22) Filed: Sep. 30, 2019

(65) Prior Publication Data
US 2021/0099146 A1 Apr. 1, 2021

(51) Int. Cl.
| | |
|---|---|
| H03G 3/00 | (2006.01) |
| H03G 3/32 | (2006.01) |
| H03G 3/30 | (2006.01) |
| H04M 3/56 | (2006.01) |
| G06T 7/73 | (2017.01) |

(52) U.S. Cl.
CPC ............... *H03G 3/32* (2013.01); *G06T 7/73* (2017.01); *H03G 3/301* (2013.01); *H04M 3/568* (2013.01)

(58) Field of Classification Search
CPC ...................................................... H03G 3/00
See application file for complete search history.

(56) References Cited

U.S. PATENT DOCUMENTS

| | | | |
|---|---|---|---|
| 8,208,664 B2 | 6/2012 | Iwasaki | |
| 9,774,896 B2 | 9/2017 | Clavenna et al. | |
| 10,034,111 B1 | 7/2018 | Barbier et al. | |
| 2015/0078581 A1 | 3/2015 | Etter et al. | |
| 2017/0280265 A1* | 9/2017 | Po | G06F 3/162 |
| 2018/0005632 A1 | 1/2018 | Mann et al. | |
| 2018/0270599 A1* | 9/2018 | Shimada | G06T 7/70 |

OTHER PUBLICATIONS

"ClearOne "Beamformer" Microphone demonstration", PAVT, Youtube, published Jan. 9, 2019, retrieved from https://www.youtube.com/watch?v=Bepqav87D40.

(Continued)

*Primary Examiner* — Olisa Anwah
(74) *Attorney, Agent, or Firm* — John M. Rogitz; John L. Rogitz

(57) ABSTRACT

In one aspect, a first device includes at least one processor and storage accessible to the at least one processor. The storage includes instructions that may be executable by the processor to receive input from a camera and identify a second device based on the input from the camera. The second device may include at least one speaker and at least one microphone. The instructions may also be executable to identify a current location of the second device within an environment based on the input from the camera and to identify a current location of an object within the environment that is different from the second device. The instructions may then be executable to provide a command to alter operation of the at least one speaker and/or the at least one microphone based on the current location of the second device and the current location of the object.

20 Claims, 6 Drawing Sheets

(56) References Cited

OTHER PUBLICATIONS

"ClearOne Beamformng Microphone Array 2-microphone", CDW, retrieved Mar. 21, 2019 from https://www.cdw.com/product/ClearOne-Beamforming-Microphone-Array-2-microphone/4398765?cm_cat=google&cm_ite=4398765&cm_pla=NA-NA-Clearone_TP&cm_ven=acquirgy&ef_id=CjwKCAjwqqrmBRAAEiwAdpDXtNxPjiKCKaEQ9FGgDx5w3D7SEahSa_gNPWpZIRT0F4OGkXJ_sKkU2RoCCS4QAvD_BwE:G.

Ramirez Flores et al., "Techniques to Optimize Microphone and Speaker Array Based on Presence and Location", file history of related U.S. Appl. No. 16/369,348, filed Mar. 29, 2019.

\* cited by examiner

TECHNIQUES FOR USING COMPUTER VISION TO ALTER OPERATION OF SPEAKER(S) AND/OR MICROPHONE(S) OF DEVICE

FIELD

The present application relates to technically inventive, non-routine solutions that are necessarily rooted in computer technology and that produce concrete technical improvements.

BACKGROUND

As recognized herein, stand-alone telephone conferencing devices are sometimes used for two or more people to participate in a conference. However, as also recognized herein, depending on the characteristics of the environment in which the conferencing device is located, the conferencing device may output sub-optimal sound, be unable to effectively detect speaker input, and/or detect too much ambient sound for a person on the other end of the call to decipher what the other person is saying. There are currently no adequate solutions to the foregoing computer-related, technological problem regarding the insufficient functionality of these types of devices.

SUMMARY

Accordingly, in one aspect a device includes at least one processor and storage accessible to the at least one processor. The storage includes instructions executable by the at least one processor to receive input from a camera and to identify a second device based on the input from the camera. The second device includes at least one speaker and at least one microphone. The instructions are also executable to identify a current location of the second device within an environment based on the input from the camera and to identify a current location of at least one object within the environment that is different from the second device. The instructions may then be executable to provide a command to alter operation of one or more of the at least one speaker and the at least one microphone based on the current location of the second device and the current location of the at least one object. For example, the command may be transmitted to the second device.

In some implementations, the current locations may be identified using at least one computer vision algorithm. The at least one computer vision algorithm may, in some examples, employ augmented reality (AR) processing. Furthermore, the AR processing may be employed to mimic sound waves as emanating from the second device and striking the at least one object, with identification of the sound waves striking the at least one object being used to provide the command. Thus, in some examples the instructions may be executable by the at least one processor to identify the current location of the at least one object responsive to the identification of the sound waves striking the at least one object.

In some examples, the second device may be identified as a conferencing device. Also in some examples, the first device may include a server, a headset, a tablet computer, and/or a smart phone.

Additionally, in some example implementations the at least one microphone may include first and second microphones with the first microphone being oriented toward the at least one object, and the command may indicate that the first microphone is to be deactivated. Alternatively, the command may indicate that the first microphone is to remain activated but have its sensitivity level reduced.

Also in some example implementations, the at least one speaker may include first and second speakers with the first speaker may be oriented toward the at least one object, and the command may indicate that the first speaker is to be deactivated. Alternatively, the command may indicate that the first speaker is to remain activated but have its volume output level reduced.

Still further, in some examples the instructions may be executable by the at least one processor to provide the command to alter operation of one or more of the at least one speaker and the at least one microphone based on a determination that the second device is within a threshold non-zero distance to the at least one object.

In another aspect, a method includes receiving, at an apparatus, data related to a current location of a device and related to a current location of at least one object other than the device. The device at least includes at least one speaker. The method also includes using the apparatus and computer vision to alter operation of the at least one speaker based on the data. The apparatus may include one or more of a headset, a server, and the device.

Additionally, in some examples the method may include using computer vision and the data to identify the current location of the device, the current location of the at least one object, and an orientation of a first speaker of the at least one speaker. In these examples, the method may then include using the current location of the device, the current location of the at least one object, and the orientation of the first speaker to identify that the first speaker is at least partially facing the at least one object. The method may then include altering, responsive to identifying that the first speaker is at least partially facing the at least one object, operation of the first speaker by either turning the first speaker off or reducing its volume output level.

In still another aspect, a least one computer readable storage medium (CRSM) that is not a transitory signal includes instructions executable by at least one processor to receive camera input and, based on the camera input, use computer vision to identify a current location of a second device and to identify a current location of at least one object in relation to the current location of the second device. The object is something other than the second device, and the second device at least includes at least one speaker. The instructions are also executable to provide a command to alter operation of the at least one speaker based on the use of computer vision, with the command indicating that the at least one speaker should either not produce sound, have its volume output level reduced, or have its volume output level increased.

In some implementations, the camera input may be first camera input, the first camera input may be received at a first time, the computer vision may be computer vision used in a first instance, and the command may be a first command. In these implementations, the instructions may be executable by the at least one processor to receive second camera input at a second time later than the first time and, based on the second camera input, use computer vision in a second instance to determine that the current location of the second device has changed. The instructions may then be executable to provide a second command to alter operation of the at least one speaker based on the use of computer vision in the second instance, with the command indicating that the at least one speaker should either not produce sound, have its volume output level reduced, or have its volume output level increased.

Additionally, in some examples the computer vision may include augmented reality (AR) processing, and the AR processing may be used to mimic sound as emanating from the at least one speaker and impinging the at least one object. Identification of the sound as impinging the at least one object may then be used to provide the second command.

The details of present principles, both as to their structure and operation, can best be understood in reference to the accompanying drawings, in which like reference numerals refer to like parts, and in which:

DETAILED DESCRIPTION

Figure 1:
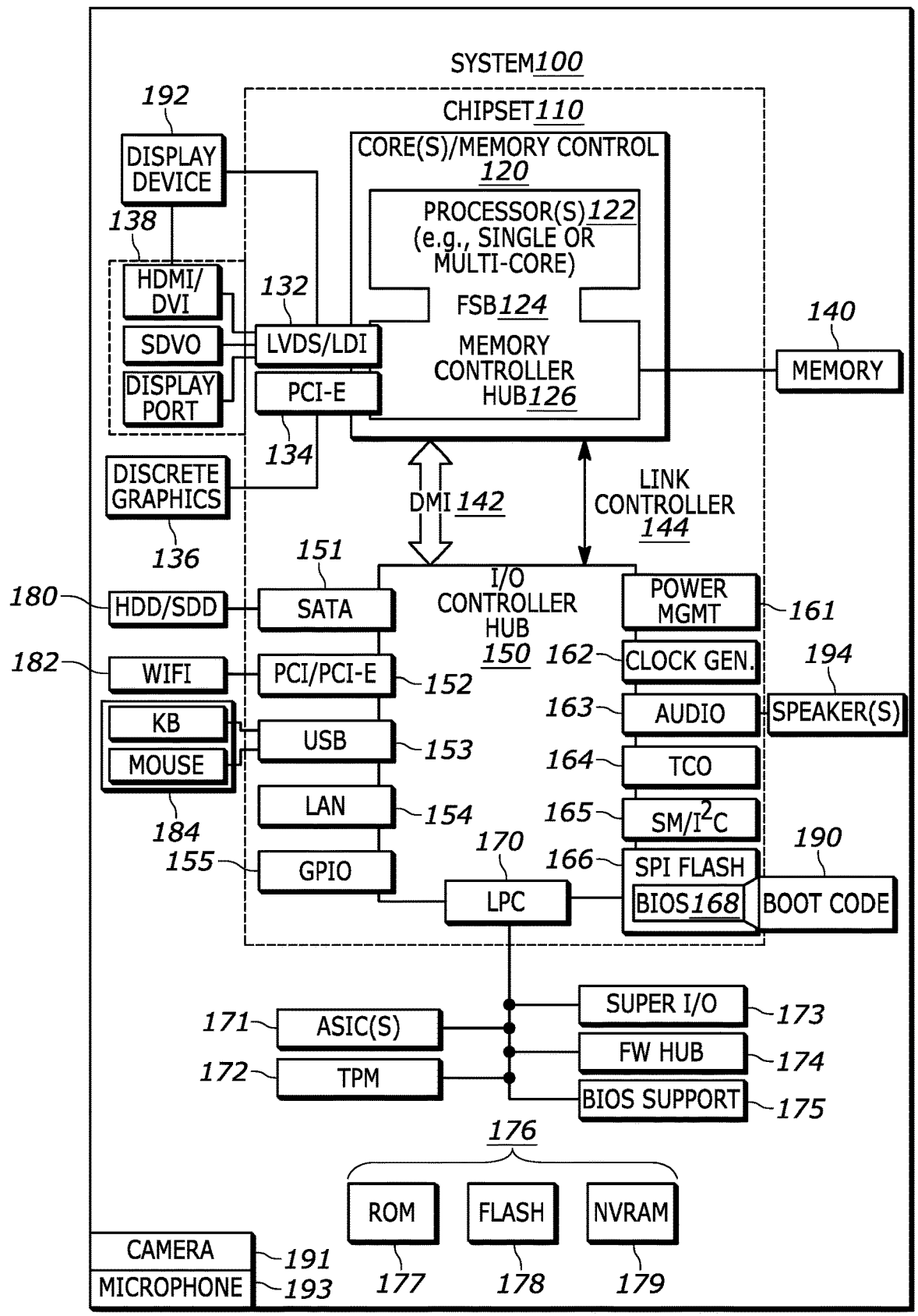
FIG. 1 is a block diagram of an example system consistent with present principles.

The present application, in part, describes devices and methods for a user/device to visually see and correct sound dispersion for a conferencing device utilizing augmented reality (AR) technology. For example, another device (e.g., headset) may use augmented reality to first identify the conferencing device within a room using the conferencing device's unique hardware design (e.g., hardware design is used as the visual marker). The headset may also identify the conferencing device's position and orientation in the environment. Then, knowing the position, the headset may show, via its heads-up display, where audio would come out of the conferencing device (e.g., via fixed audio perforation holes). The headset may also show where audio from the conferencing device would be disrupted by environmental and contextual objects.

The environmental and contextual object(s) themselves may be identified using AR technology, and their positions relative to the conferencing device may also be identified. This information may then be stored and directed back to a cloud server to alter the operation of the conferencing device's audio stream by updating the device's unique software and/or drivers. The conferencing device may then be automatically updated accordingly, and can be managed virtually from a management system on the cloud server.

For example, a camera on the headset may capture where in the environment big objects are located using AR processing, such as displays, chairs, tables, furniture, windows, whiteboards, or other objects. The headset may then send this image data to a cloud management system that can use audio enhancing and tweaking technologies to adjust the conferencing device's audio streams to optimize audio flow in the environment and make future adjustments later. The adjustments can positively affect audio quality by, e.g., minimizing audio bounce feedback and performing echo cancellation.

As another example, consider a conferencing device deployed in a small huddle room. A user may come into the room and use his or her headset's AR processing to improve the audio performance of the conferencing device. To do so, the headset may scan the room and identify items that might block sound from the conferencing device and their positions in the room. That information may be routed to a cloud portal for the portal to update or adjust audio detection and reproduction by the conferencing device to fit the current environment and relative positions of the objects with respect to the conferencing device. E.g., were the conferencing device to be on a table and pushed up against a large display in the room, the microphone located on the back of the conferencing device that faces the large display and that gets bounce interference from sound hitting the display after being emitted from the conferencing device itself may cause poor audio performance. The software for the conferencing device may therefore automatically update to disable the back speaker facing the large display and only use speakers within the 270 degrees that are unblocked by the large display so as to reduce or eliminate the interference.

Prior to delving into the details of the instant techniques, with respect to any computer systems discussed herein, a system may include server and client components, connected over a network such that data may be exchanged between the client and server components. The client components may include one or more computing devices including televisions (e.g., smart TVs, Internet-enabled TVs), computers such as desktops, laptops and tablet computers, so-called convertible devices (e.g., having a tablet configuration and laptop configuration), and other mobile devices including smart phones. These client devices may employ, as non-limiting examples, operating systems from Apple Inc. of Cupertino Calif., Google Inc. of Mountain View, Calif., or Microsoft Corp. of Redmond, Wa. A Unix® or similar such as Linux® operating system may be used. These operating systems can execute one or more browsers such as a browser made by Microsoft or Google or Mozilla or another browser program that can access web pages and applications hosted by Internet servers over a network such as the Internet, a local intranet, or a virtual private network.

As used herein, instructions refer to computer-implemented steps for processing information in the system. Instructions can be implemented in software, firmware or hardware, or combinations thereof and include any type of programmed step undertaken by components of the system; hence, illustrative components, blocks, modules, circuits, and steps are sometimes set forth in terms of their functionality.

A processor may be any general purpose single- or multi-chip processor that can execute logic by means of various lines such as address lines, data lines, and control lines and registers and shift registers. Moreover, any logical blocks, modules, and circuits described herein can be implemented or performed with a general purpose processor, a digital signal processor (DSP), a field programmable gate array (FPGA) or other programmable logic device such as an application specific integrated circuit (ASIC), discrete gate or transistor logic, discrete hardware components, or any combination thereof designed to perform the functions described herein. A processor can also be implemented by a controller or state machine or a combination of computing devices. Thus, the methods herein may be implemented as software instructions executed by a processor, suitably configured application specific integrated circuits (ASIC) or field programmable gate array (FPGA) modules, or any other convenient manner as would be appreciated by those skilled in those art. Where employed, the software instructions may also be embodied in a non-transitory device that is being vended and/or provided that is not a transitory, propagating signal and/or a signal per se (such as a hard disk drive, CD ROM or Flash drive). The software code instructions may also be downloaded over the Internet. Accordingly, it is to be understood that although a software application for undertaking present principles may be vended with a device such as the system 100 described below, such an application may also be downloaded from a server to a device over a network such as the Internet.

Software modules and/or applications described by way of flow charts and/or user interfaces herein can include various sub-routines, procedures, etc. Without limiting the disclosure, logic stated to be executed by a particular module can be redistributed to other software modules and/or combined together in a single module and/or made available in a shareable library.

Logic when implemented in software, can be written in an appropriate language such as but not limited to C# or C++, and can be stored on or transmitted through a computer-readable storage medium (that is not a transitory, propagating signal per se) such as a random access memory (RAM), read-only memory (ROM), electrically erasable programmable read-only memory (EEPROM), compact disk read-only memory (CD-ROM) or other optical disk storage such as digital versatile disc (DVD), magnetic disk storage or other magnetic storage devices including removable thumb drives, etc.

In an example, a processor can access information over its input lines from data storage, such as the computer readable storage medium, and/or the processor can access information wirelessly from an Internet server by activating a wireless transceiver to send and receive data. Data typically is converted from analog signals to digital by circuitry between the antenna and the registers of the processor when being received and from digital to analog when being transmitted. The processor then processes the data through its shift registers to output calculated data on output lines, for presentation of the calculated data on the device.

Components included in one embodiment can be used in other embodiments in any appropriate combination. For example, any of the various components described herein and/or depicted in the Figures may be combined, interchanged or excluded from other embodiments.

"A system having at least one of A, B, and C" (likewise "a system having at least one of A, B, or C" and "a system having at least one of A, B, C") includes systems that have A alone, B alone, C alone, A and B together, A and C together, B and C together, and/or A, B, and C together, etc.

The term "circuit" or "circuitry" may be used in the summary, description, and/or claims. As is well known in the art, the term "circuitry" includes all levels of available integration, e.g., from discrete logic circuits to the highest level of circuit integration such as VLSI, and includes programmable logic components programmed to perform the functions of an embodiment as well as general-purpose or special-purpose processors programmed with instructions to perform those functions.

Now specifically in reference to FIG. 1, an example block diagram of an information handling system and/or computer system 100 is shown that is understood to have a housing for the components described below. Note that in some embodiments the system 100 may be a desktop computer system, such as one of the ThinkCentre® or ThinkPad® series of personal computers sold by Lenovo (US) Inc. of Morrisville, N.C., or a workstation computer, such as the ThinkStation®, which are sold by Lenovo (US) Inc. of Morrisville, N.C.; however, as apparent from the description herein, a client device, a server or other machine in accordance with present principles may include other features or only some of the features of the system 100. Also, the system 100 may be, e.g., a game console such as XBOX®, and/or the system 100 may include a mobile communication device such as a mobile telephone, notebook computer, and/or other portable computerized device.

As shown in FIG. 1, the system 100 may include a so-called chipset 110. A chipset refers to a group of integrated circuits, or chips, that are designed to work together. Chipsets are usually marketed as a single product (e.g., consider chipsets marketed under the brands INTEL®, AMD®, etc.).

In the example of FIG. 1, the chipset 110 has a particular architecture, which may vary to some extent depending on brand or manufacturer. The architecture of the chipset 110 includes a core and memory control group 120 and an I/O controller hub 150 that exchange information (e.g., data, signals, commands, etc.) via, for example, a direct management interface or direct media interface (DMI) 142 or a link controller 144. In the example of FIG. 1, the DMI 142 is a chip-to-chip interface (sometimes referred to as being a link between a "northbridge" and a "southbridge").

The core and memory control group 120 include one or more processors 122 (e.g., single core or multi-core, etc.) and a memory controller hub 126 that exchange information via a front side bus (FSB) 124. As described herein, various components of the core and memory control group 120 may be integrated onto a single processor die, for example, to make a chip that supplants the "northbridge" style architecture.

The memory controller hub 126 interfaces with memory 140. For example, the memory controller hub 126 may provide support for DDR SDRAM memory (e.g., DDR, DDR2, DDR3, etc.). In general, the memory 140 is a type of random-access memory (RAM). It is often referred to as "system memory."

The memory controller hub 126 can further include a low-voltage differential signaling interface (LVDS) 132. The LVDS 132 may be a so-called LVDS Display Interface (LDI) for support of a display device 192 (e.g., a CRT, a flat panel, a projector, a touch-enabled light emitting diode display or other video display, etc.). A block 138 includes some examples of technologies that may be supported via the LVDS interface 132 (e.g., serial digital video, HDMI/DVI, display port). The memory controller hub 126 also includes one or more PCI-express interfaces (PCI-E) 134, for example, for support of discrete graphics 136. Discrete graphics using a PCI-E interface has become an alternative approach to an accelerated graphics port (AGP). For example, the memory controller hub 126 may include a 16-lane (×16) PCI-E port for an external PCI-E-based graphics card (including, e.g., one of more GPUs). An example system may include AGP or PCI-E for support of graphics.

In examples in which it is used, the I/O hub controller 150 can include a variety of interfaces. The example of FIG. 1 includes a SATA interface 151, one or more PCI-E interfaces 152 (optionally one or more legacy PCI interfaces), one or more USB interfaces 153, a LAN interface 154 (more generally a network interface for communication over at least one network such as the Internet, a WAN, a LAN, etc. under direction of the processor(s) 122), a general purpose I/O interface (GPIO) 155, a low-pin count (LPC) interface 170, a power management interface 161, a clock generator interface 162, an audio interface 163 (e.g., for speakers 194 to output audio), a total cost of operation (TCO) interface 164, a system management bus interface (e.g., a multi-master serial computer bus interface) 165, and a serial peripheral flash memory/controller interface (SPI Flash) 166, which, in the example of FIG. 1, includes BIOS 168 and boot code 190. With respect to network connections, the I/O hub controller 150 may include integrated gigabit Ethernet controller lines multiplexed with a PCI-E interface port. Other network features may operate independent of a PCI-E interface.

The interfaces of the I/O hub controller 150 may provide for communication with various devices, networks, etc. For example, where used, the SATA interface 151 provides for reading, writing or reading and writing information on one or more drives 180 such as HDDs, SDDs or a combination thereof, but in any case the drives 180 are understood to be, e.g., tangible computer readable storage mediums that are not transitory, propagating signals. The I/O hub controller 150 may also include an advanced host controller interface (AHCI) to support one or more drives 180. The PCI-E interface 152 allows for wireless connections 182 to devices, networks, etc. The USB interface 153 provides for input devices 184 such as keyboards (KB), mice and various other devices (e.g., cameras, phones, storage, media players, etc.).

In the example of FIG. 1, the LPC interface 170 provides for use of one or more ASICs 171, a trusted platform module (TPM) 172, a super I/O 173, a firmware hub 174, BIOS support 175 as well as various types of memory 176 such as ROM 177, Flash 178, and non-volatile RAM (NVRAM) 179. With respect to the TPM 172, this module may be in the form of a chip that can be used to authenticate software and hardware devices. For example, a TPM may be capable of performing platform authentication and may be used to verify that a system seeking access is the expected system.

The system 100, upon power on, may be configured to execute boot code 190 for the BIOS 168, as stored within the SPI Flash 166, and thereafter processes data under the control of one or more operating systems and application software (e.g., stored in system memory 140). An operating system may be stored in any of a variety of locations and accessed, for example, according to instructions of the BIOS 168.

Additionally, the system 100 may include one or more cameras 191 that gather images and provide input related thereto to the processor 122. The cameras 191 may be thermal imaging cameras, infrared (IR) cameras, digital cameras such as webcams, three-dimensional (3D) cameras, and/or cameras otherwise integrated into the system 100 and controllable by the processor 122 to gather pictures/images and/or video. Still further, the system 100 may include one or more audio receivers/microphones 193 that provide input audio input to the processor 122 based on audio that is detected, such as via a user providing audible input to the microphone 193 while engaging in a telephonic conference consistent with present principles.

Additionally, though not shown for simplicity, in some embodiments the system 100 may include a gyroscope that senses and/or measures the orientation of the system 100 and provides input related thereto to the processor 122, as well as an accelerometer that senses acceleration and/or movement of the system 100 and provides input related thereto to the processor 122. Also, the system 100 may include a GPS transceiver that is configured to communicate with at least one satellite to receive/identify geographic position information and provide the geographic position information to the processor 122. However, it is to be understood that another suitable position receiver other than a GPS receiver may be used in accordance with present principles to determine the location of the system 100.

It is to be understood that an example client device or other machine/computer may include fewer or more features than shown on the system 100 of FIG. 1. In any case, it is to be understood at least based on the foregoing that the system 100 is configured to undertake present principles.

Figure 2:
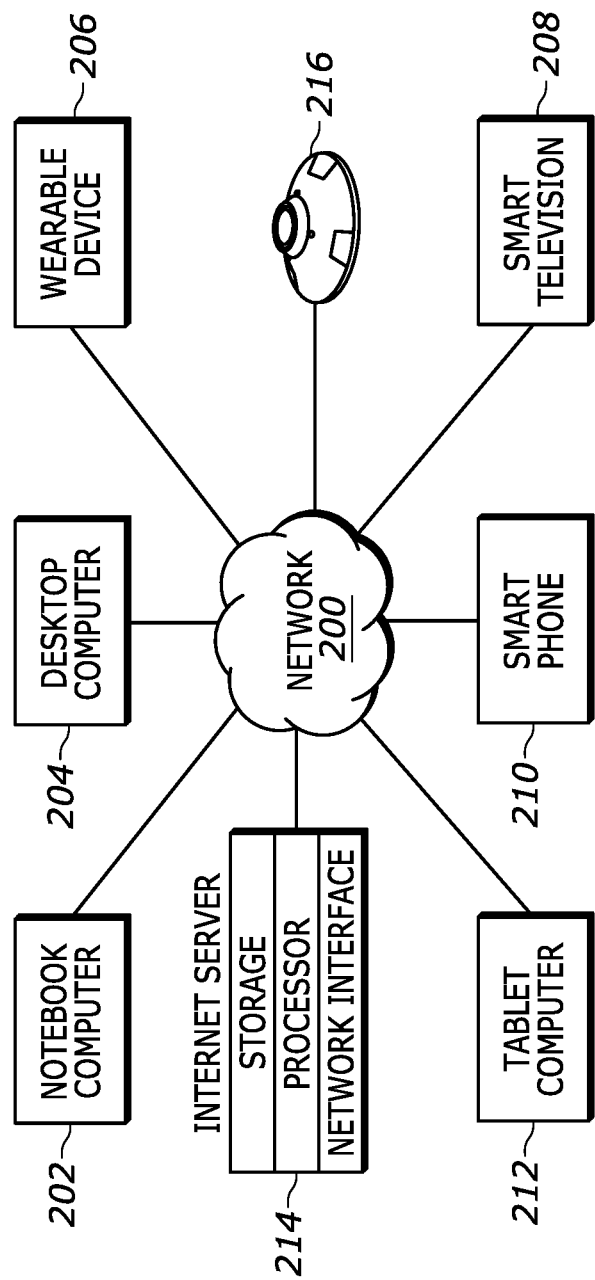
FIG. 2 is a block diagram of an example network of devices consistent with present principles.

Turning now to FIG. 2, example devices are shown communicating over a network 200 such as the Internet in accordance with present principles. It is to be understood that each of the devices described in reference to FIG. 2 may include at least some of the features, components, and/or elements of the system 100 described above. Indeed, any of the devices disclosed herein may include at least some of the features, components, and/or elements of the system 100 described above.

FIG. 2 shows a notebook computer and/or convertible computer 202, a desktop computer 204, a wearable device 206 such as a smart watch, a smart television (TV) 208, a smart phone 210, a tablet computer 212, a conferencing device 216, and a server 214 such as an Internet server that may provide cloud storage accessible to the devices 202-212, 216. It is to be understood that the devices 202-216 are configured to communicate with each other over the network 200 to undertake present principles.

Figure 3:
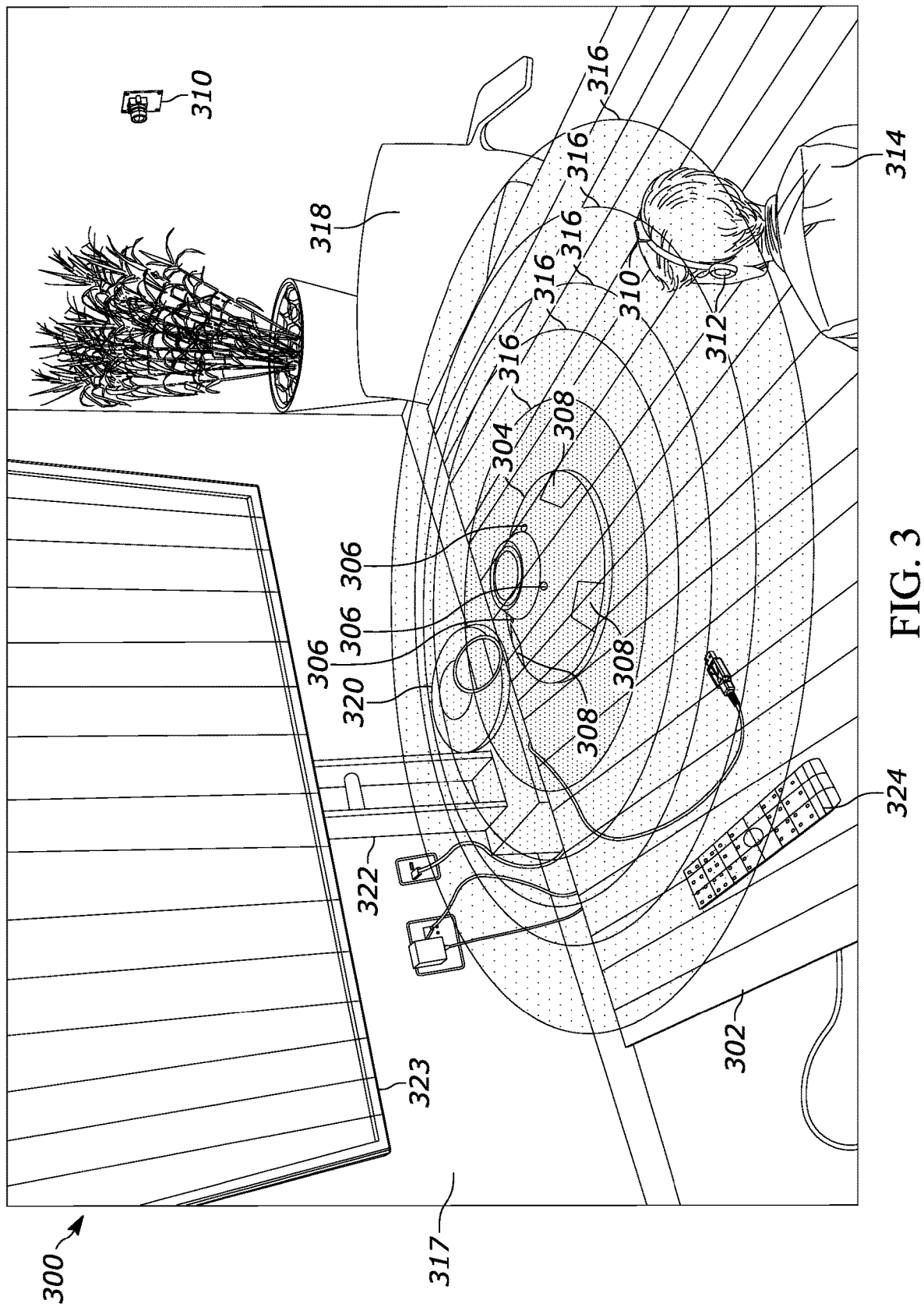
FIGS. 3 and 4 show example illustrations of AR graphics based on the locations of respective objects within an environment consistent with present principles.
Figure 4:
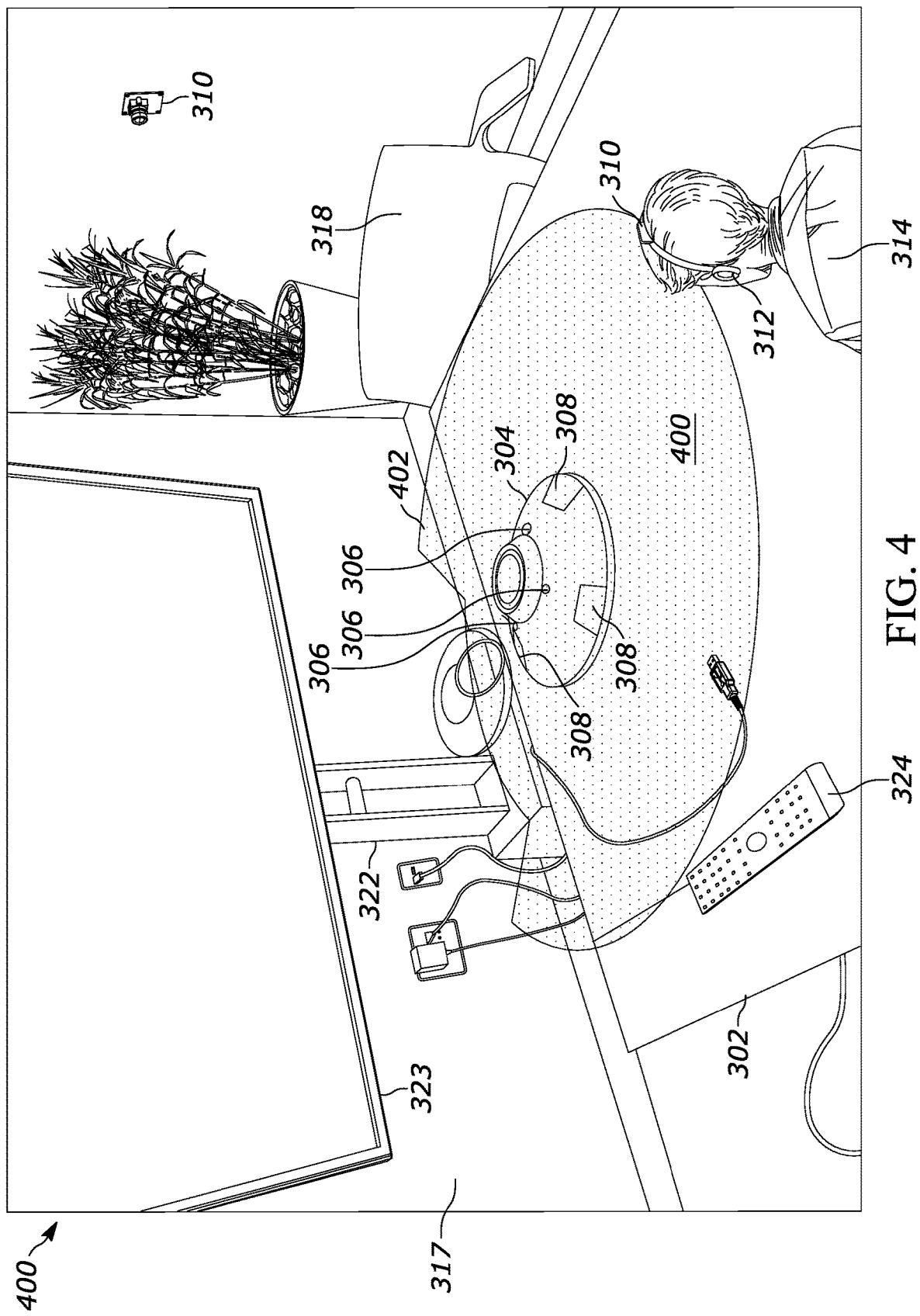

Referring now to FIGS. 3 and 4, an environment 300 such as a conference room is shown. Sitting on a table 302 is a conferencing device 304 (though in other examples the device 304 may be located elsewhere such as e.g., on a wall or on/coupled to a television). The device 304 may be used for facilitating a conference call and accordingly may have a network interface (not shown) for communicating over one or more Internet and/or telephone networks as well as for communicating with a server according to present principles. The device 304 may also include an electronic display (not shown), as well as plural microphones 306 and plural speakers 308 located on the device 304 at different locations for facilitating a conference call by detecting audio to present as part of the call via the microphones 306 and presenting audio of call participants via speakers 308.

Also note that within the environment 300 may be one or more cameras 310 that may be mounted to a wall 317 and/or disposed an end-user device such as a smart phone, tablet computer, laptop computer, or the headset 312 shown as worn by a user 314. The cameras 310 may communicate with the other devices disclosed herein, including the device 304 and any remotely-located servers or other devices for undertaking present principles.

Further, it is to be understood in reference to FIGS. 3 and 4 that they show the environment 300 from the perspective of the user 314 while wearing the headset 312 and viewing the environment 300 through the heads up transparent display of the headset 312. Consistent with present principles, the headset 312 (and/or a server) may use images from the camera(s) 310 to identify the conferencing device 304 as such, while also identifying its location (e.g., absolute location). Based on identifying the conferencing device 304, the headset 312 may determine that operation of its microphones 306 and speakers 308 might need to be adjusted based on the current position of the device 304 within the environment 300.

Accordingly, the headset 312 and/or a server communicating with it may receive images from the camera(s) 310 and execute a computer/machine vision algorithm to identify not just the location of the device 304 but also other objects within the environment 300 and their respective locations, e.g., with respect to the headset 312 if not absolutely. The headset 312 and/or server may then execute augmented reality processing to, as shown in FIG. 3, present AR graphics on the heads up display of the headset 312 to mimic sound waves 316 as emanating from locations of the identified speakers 308 and possibly striking other objects within the environment 300, such as the wall 317, a chair 318, a computer 320, and a stand 322 of a television 323.

Then as shown in FIG. 4, based on identifying the sound waves as striking those objects, the headset 312 and/or server may command the display of the headset 312 to present an AR graphic 400 that visually indicates areas at which sound from the device 304 may emanate unobstructed and/or from which a person may speak into a microphone of the device 304. As shown, an inlet 402 indicates an area outside of the graphic 400 where a portion of the wall 317, the computer 320, and the stand 322 have been determined to be within a threshold distance of the device 304 and also struck by the waves 316. This may indicate to the user 314 that the portion of the wall 317, the computer 320 and stand 322 may cause undesirable effects when sound is produced by the particular speaker 308 that faces those objects (such as echo or undue sound absorption/dampening, depending on the material of the objects 320, 322). This may also indicate to the user 314 that the respective microphone 306 facing those objects is not currently needed for conferencing as no one would be speaking from that direction.

Accordingly, the headset 312 and/or the server may provide a command to the respective microphone 306 and speaker 308 facing the portion of the wall 317 and objects 320 and 322 to alter their operation. For example, the respective speaker 308 facing the objects 317, 320, 322 may be turned off or have its volume output level reduced. Additionally, the respective microphone 306 facing the objects 317, 320, 322 may be turned off so as to not cause microphone pickup of an echo off those objects or other undesirable audio effects.

Also note that since the chair 318 has been determined to be outside of the threshold distance to the device 304, the respective microphone 306 and speaker 308 facing it will not have their operation adjusted. Similarly, microphones 306 and speakers 308 facing other portions of the wall 317 outside of the threshold distance may also not have their operation adjusted.

Further, note that while a remote control 324 is shown as being within the threshold distance and also being struck by the waves 316, the respective microphone 306 and speaker 308 oriented toward it will not have their operation adjusted owing to the headset 312 and/or server determining based on object type and/or object size (using the computer vision algorithm and/or an object recognition algorithm) that the remote control 324 will not absorb/echo enough sound from the respective speaker 308 oriented toward it and/or block a user from speaking into the respective microphone 306 oriented toward it. In some examples, a lookup table may even be accessed for the headset 312 and/or server to make these determinations. The lookup table may correlate object type and/or object size to whether the particular object or size would significantly absorb or echo sound from a speaker facing in its direction (and hence the lookup table may indicate that such a speaker should have its operation adjusted). The lookup table may also correlate object type and/or object size to whether the particular object or size would significantly obstruct a person located in the direction that an associated microphone faces from speaking into that microphone (and hence the lookup table may indicate that such a microphone should have its operation adjusted). The lookup table may be configured by a developer of the headset 312 or server, for example.

Note that "facing" or "oriented toward" as mentioned herein may, in some examples, be in reference to a central axis of a respective microphone or speaker that is orthogonal to a front-facing surface or plane of the respective microphone or speaker itself (facing away from the device 304). The central axis may thus intersect a portion of the respective object it faces (for "facing"), or at least a portion of the respective object may at least be within a threshold angle of the central axis itself (for "oriented toward").

Figure 5:
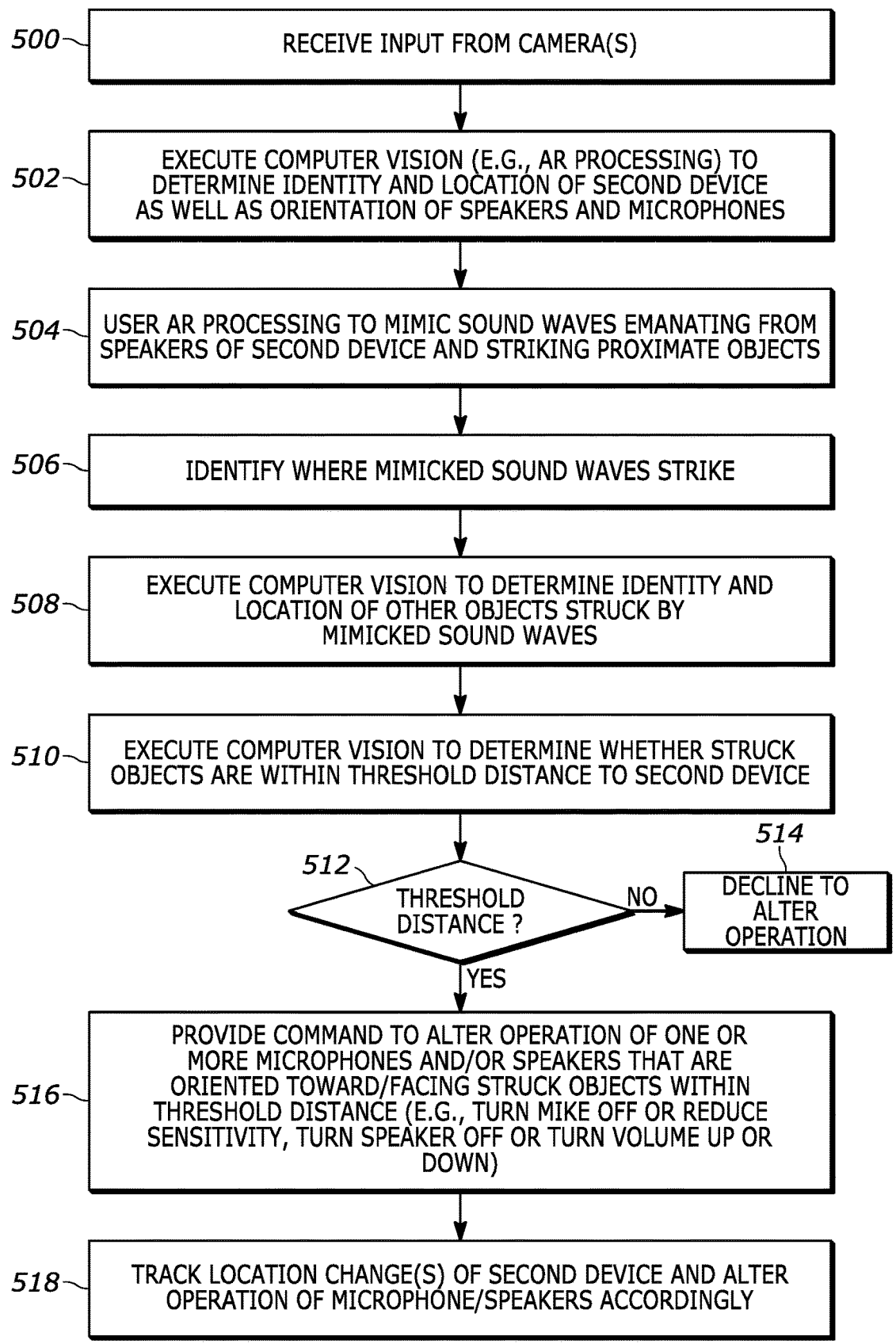
FIG. 5 is a flow chart of an example algorithm consistent with present principles.

Referring now to FIG. 5, it shows example logic that may be executed by a first device such as the system 100, the headset 312, a server communicating with the headset 312 and/or other cameras within an environment consistent with present principles, etc. In some examples, the logic of FIG. 5 may even be executed by the device 304.

Beginning at block 500, the first device may receive input from one or more cameras imaging the environment, such as still pictures and/or video.

The logic may then proceed to block 502 where the first device may execute computer vision and object recognition to determine the identity and location of another device within the room that may be used for conferencing (referred to below as the "second device") as well as the orientation (e.g., outward facing direction) of any of its speakers and microphones. In some examples, the specific model of the second device may be identified and, even if the locations of the second device's microphones and speakers are not visible in the camera input, their location and orientation on the second device may be inferred based on their known locations on the second device relative to aspects of the housing itself that are recognizable by the first device via the camera input.

In relation to computer vision, it is to be understood consistent with present principles that in some embodiments computer vision may include the type of computer/machine vision used in augmented reality (AR) processing to determine the real world location of objects relative to each other for presentation of AR objects or other virtual images as appearing at certain locations in the real world. Thus, computer vision may include image registration, and/or receiving and analyzing digital images to extract three dimensional data from the images for location reference. To this end, artificial intelligence models employing one or more neural networks may be used for making inferences about and/or mapping the real world locations of objects with respect to each other as shown in images from a camera. Simultaneous localization and mapping (SLAM) algorithms may also be used.

Still in reference to FIG. 5, from block 502 the logic may then proceed to block 504. At block 504 the first device may use AR processing/algorithms to mimic sound waves as emanating from the identified location of the speakers (or microphones) of the second device and possibly striking proximate objects consistent with present principles. For example, the first device may mimic the sound waves as concentric circles (or half circles) emanating from each speaker or from a central point of the second device itself, with each circle beginning at a different time with a near zero radius and gradually expanding to a threshold non-zero radius (e.g., one foot) before disappearing. Proximate objects may thus be objects in the real world that are at least within this threshold radius. Also, note that the plane of the mimicked sound waves themselves may be parallel to if not along the central axis of the speaker's outward facing direction (e.g., in three dimensions). However, in other embodiments note that the threshold radius may be used to mimic a sphere of sound waves emanating from the second device in all three dimensions, rather than to mimic circles.

In any case, from block 504 the logic may then proceed to block 506. At block 506 the first device may identify where the mimicked sound waves strike real world objects within the environment. The logic may then proceed to block 508 where the first device may execute computer vision as well as object recognition to determine the identity and location of other objects struck by the mimicked sound waves, with location being determined with respect to the first and/or second devices if not determined absolutely, which may also be done.

From block 508 the logic may then move to block 510. At block 510 the first device may execute computer vision to determine whether any objects mimicked as being struck by the virtual sound waves are within a threshold non-zero distance of the second device (e.g., objects like walls or the table itself on which the second device is disposed), such as along the plane of the sound waves or in any direction relative to the second device (e.g., if a sphere of sound waves were mimicked). In some examples, the threshold non-zero distance may be the same as the threshold radius referenced above (e.g., three feet). From block 510 the logic may then proceed to decision diamond 512.

At diamond 512 the first device may actually determine whether any of the objects mimicked as being struck by the virtual sound waves are within the threshold distance. Responsive to a negative determination, the logic may proceed to block 514 where the first device may decline to alter the operation of the second device and instead allow it to operate as it normally would or as it has already been configured to operate. For instance, the first device may decline to turn any of the microphones or speakers off if they are already on, may decline to reduce or increase the volume output level for the speakers, and/or may decline to reduce the sensitivity level of any of the microphones.

However, responsive to an affirmative determination at diamond 512, the logic may instead proceed to block 516. At block 516 the first device may provide (e.g., wirelessly transmit) a command to the second device for the second device to alter operation of one or more of its microphones and/or speakers that are determined based on computer vision to be oriented toward or facing the objects mimicked as being struck by the virtual sound waves. For example, a microphone facing a struck object may be commanded to turn off or reduce its sensitivity level. As another example, a speaker facing a struck object may be commanded to turn off, or to turn its volume output level up (e.g., if the object is determined to absorb sound) or down (e.g., if the object is determined to reflect sound). The second device may then alter its operation accordingly.

From block 516 the first device may then proceed to block 518. At block 518 the first device may track any location changes for the second device and command the second device to alter the operation of its microphones and speakers accordingly (e.g., repeat the steps of FIG. 5 based on the new location of the second device). This may occur, for example, where the second device is battery powered and configured for wireless communication and a user moves the second device from one location on a conference table to another location on the conference table (or even to a different environment all while a telephone conference call is being conducted).

Figure 6:
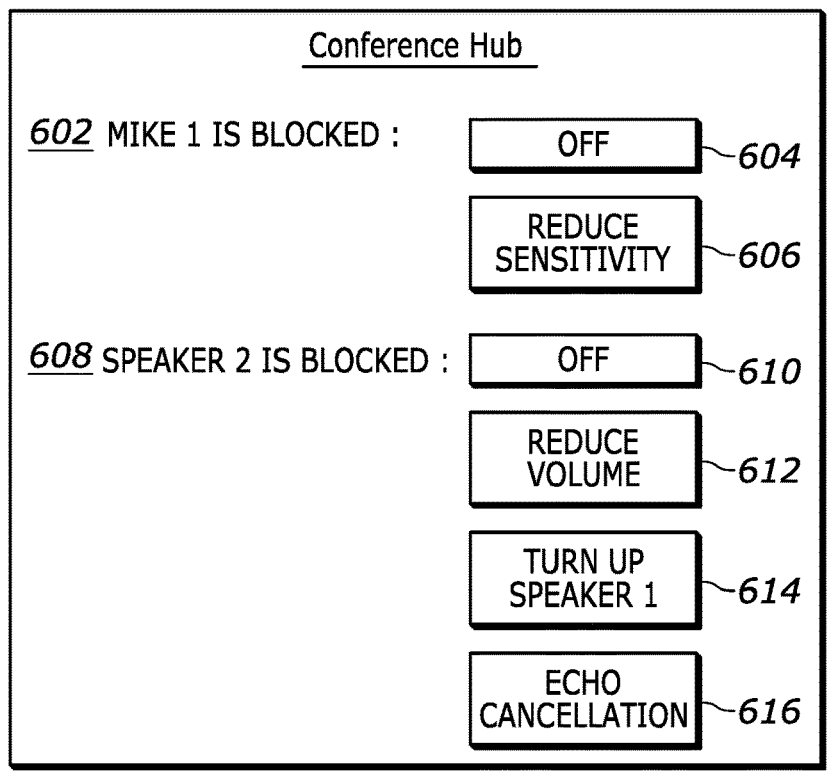
FIG. 6 shows an example graphical user interface (GUI) for controlling microphones and speakers of a conferencing device consistent with present principles.

Now in reference to FIG. 6, it shows an example graphical user interface (GUI) 600 that may be presented on an electronic display accessible to the first device disclosed above in reference to FIG. 5. For example, the GUI 600 may be presented on the heads up display of the headset 312, or smartphone display or laptop display accessible to the headset 312 or server undertaking the logic of FIG. 5.

It is to be further understood consistent with FIG. 6 that while the first device may in some embodiments be configured to automatically command the second device according to block 516 as described above, there may be other instances where a user may have configured the first device (or even the second device) to only alter operation of the second device based on user command. Thus, rather than providing a command to automatically alter operation at block 516, in some examples an affirmative determination at diamond 512 may cause the first device to present the GUI of FIG. 6 so that a user may direct touch or mouse input to various selectors to alter operation of the second device.

As shown in FIG. 6, the GUI 600 may provide an indication 602 that a particular microphone is "blocked" owing to the first device determining that this microphone is facing or oriented toward an object within the threshold distance to the second device. A user may then choose how to alter the operation of that particular microphone. For example, the user may select selector 604 to turn that microphone off or select selector 606 to reduce its sensitivity for detecting sound.

The GUI 600 also shows an example indication 608 that a particular speaker is similarly "blocked". A user may then choose how to alter the operation of that particular speaker. For example, the user may select selector 610 to turn that speaker off, select selector 612 to reduce its volume output level, or select selector 614 to increase its volume output level. In some embodiments, the user may also select a selector 616 to command the second device to execute an echo and/or noise cancellation algorithm concurrent with operation according to the reduced or increase volume output level selected via the respective selectors 612, 614 so that echoes created by sound from that particular speaker and echoing off an object may be reduced or eliminated.

Figure 7:
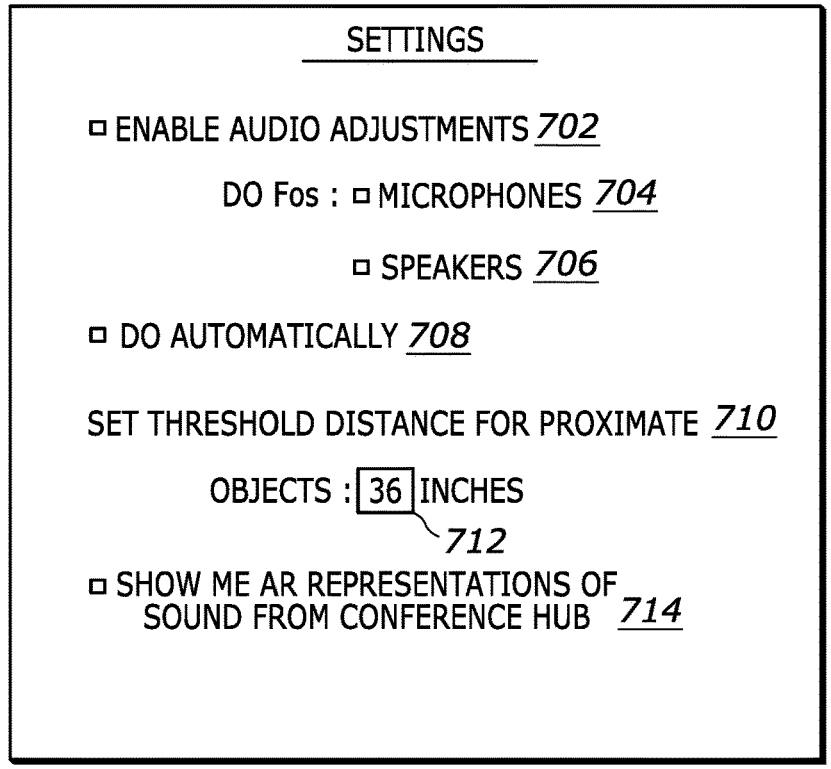
FIG. 7 shows an example GUI for configuring settings of a device consistent with present principles.

Continuing the detailed description in reference to FIG. 7, it shows an example GUI 700 that may be presented on a display accessible to the first and/or second device to configure settings for use by the device(s) consistent with present principles. It is to be understood that each of the options or sub-options to be described below may be selected by directing touch or mouse input to the adjacent check box.

As shown, the GUI 700 may include a first option 702 that is selectable to enable adjustments or alterations to the functioning of one or more microphones or speakers of a conferencing device consistent with present principles. For example, selection of the option 702 may configure a device to undertake the functions described above in reference to FIGS. 3 and 4 and/or to execute the logic of FIG. 5.

The GUI 700 may also include sub-options 704, 706 that are respectively selectable to configure the device(s) to only make alterations to the functioning of microphones (sub-option 704) or speakers (sub-option 706) of the conferencing device. In some examples, if neither of the sub-options 704, 706 are selected while the option 702 is selected, then the device(s) may make alterations for both speakers and microphones.

The GUI 700 may further include an option 708 that is selectable to configure the device(s) to make the alterations automatically, e.g., as described above in reference to block 516. Thus, for example, if option 708 is not selected then the device(s) may instead first present the GUI 600 of FIG. 6.

Still in reference to FIG. 7, the GUI 700 may further include a setting 710 for a user to set the threshold distance employed at decision diamond 512 as described above. Accordingly, an input box 712 may be presented to which a user may direct input to establish the threshold distance. In the present example, a user has set the threshold distance to thirty six inches.

Even further, in some examples the GUI 700 may also include an option 714. The option 714 may be selectable to configure the first device described in reference to FIG. 5 to present virtual representations of sound as emanating from the second device (e.g., a conferencing device) consistent with present principles. For example, selection of the option 714 may configure a setting for the headset 312 or a smart phone to use its display to present the virtual object 316 (virtual sound waves) and/or AR graphic 400 described above so that a user may visualize objects that might potentially cause undesirable sound distortions during a conference call.

Moving on from FIG. 7, it is to be understood consistent with present principles that in some examples more than one conferencing device may be present within an environment and used for a conference call between local and remote participants. In these examples, the user's headset and/or a server operating consistent with present principles may identify both conferencing devices as well as their respective locations within the environment. The headset/server may also identify the devices' audio overlap, such as a same location within the environment where respective speakers from the respective devices would both direct audio based on the respective orientations of the speakers and their current volume output levels, and such as a same location toward which respective microphones from the respective devices are facing for detection of sound from the same location. To reduce overlap, one or both of the speakers facing the overlap area may have their volume output levels reduced while other speakers facing other directions may have their volume output levels increased. Also to reduce overlap, one or both of the microphones facing the overlap area may have their sensitivity levels reduced while other microphones facing other directions may have their sensitivity levels increased.

Describing another feature consistent with present principles, note that there may be instances where two users are located within the same environment as the conferencing device during conferencing with one or more remote people. In these situations, should both users be identified as being within a threshold non-zero distance to the conferencing device, audio enhancing or signal processing may be performed to eliminate background/ambient audio (e.g., via a noise cancellation algorithm). However, if one of the users is identified as not being within the threshold non-zero distance, the background/ambient audio may not be eliminated to ensure that the user outside the threshold distance has his or her spoken words detected by at least one microphone on the conferencing device.

Furthermore, if two local users are within an open space environment not bounded by walls (e.g., a city park) and using a conferencing device, one of the user's headsets may identify as much and then control audio dispersion for sound coming from speakers of the conferencing device to direct sound in the respective directions of the users and to not disperse sound in other directions. As yet another example, if the headset determines that it and the conferencing device are disposed in a relatively large room, the conferencing device may have the volume output level of some or all of its speakers increased to ensure audio of a conference call can be heard from anywhere within the room.

Also in some examples, noise cancellation may be performed to eliminate audio being output by a conferencing device of people and objects located beyond a threshold distance. For example, if people or sound-producing objects are recognized as being outside of a "zone of use" for the conferencing device, the conferencing device may cancel audio-in detected by its microphone that originates from beyond a specific distance/range. E.g., if two users are huddled close to the conferencing device in an open workspace, a camera in communication with the conferencing device may detect people and objects outside of the two-user zone and cancel noise identified as being emitted from positions and/or directions in which those people/objects are disposed by specifying an audio-in range that encompasses only the two users nearest the conferencing device.

Still further, in some embodiments a speaker operating consistent with present principles may have its audio output tailored to "fit" a room in which it is disposed. Thus, for example, should the speaker be configured or capable of projecting audible sound to reach all boundaries of a thirty foot by thirty foot room but a headset operating consistent with present principles identify that the speaker is disposed within a ten foot by ten foot room (e.g., using computer vision or prestored data regarding the size of the room), the speaker may be commanded to automatically adjust its audio output settings based on the room size and even proximity to one or more walls of the room. E.g., the speaker may be commanded to have its volume output level lowered by a preset or proportional amount to avoid hurting the ears of users within the room while still having the audio reach all boundaries of the room.

Still further, note that object recognition by a headset or other device operating consistent with present principles may be used for "people counting" or person recognition. Thus, the headset may identify people in the room and/or users near the conferencing device and adjust the settings of its speakers and microphones accordingly based on the active speaker. For instance, when there are five people in the room, and a particular user is talking, the microphones closest to and/or oriented toward that particular user may be activated to pick up sound from that user while the other microphones further from that user or oriented in other directions (e.g., toward the other four people) may be turned off or have their sensitivity levels reduced. At the same time, in some examples one or more speakers facing that particular user may be turned off or have their volume levels reduced while that user is talking while speakers facing other people or in other directions (e.g., of the other four people) may be turned on or have their audio output levels increased for sound production. The device may continue to do so in real-time based on identification an active speaker. This might be particularly useful in cases where passive attendees are generating noise such as typing on their PCs in the back of the room so that audio of the typing is not picked up by a microphone on the conferencing device.

Before concluding, also note that present principles may apply in other instances beyond telephone/video conferencing. For example, present principles may be applied for providing music from a device with multiple speakers and microphones, and/or for receiving spoken user input for voice dictation or other speech to text functions.

It may now be appreciated that present principles provide for an improved computer-based user interface that improves the functionality and ease of use of the devices disclosed herein. The disclosed concepts are rooted in computer technology for computers to carry out their functions.

It is to be understood that whilst present principals have been described with reference to some example embodiments, these are not intended to be limiting, and that various alternative arrangements may be used to implement the subject matter claimed herein. Components included in one embodiment can be used in other embodiments in any appropriate combination. For example, any of the various components described herein and/or depicted in the Figures may be combined, interchanged or excluded from other embodiments.

What is claimed is:

1. A first device, comprising:
    at least one processor; and
    storage accessible to the at least one processor and comprising instructions executable by the at least one processor to:
    receive input from a camera;
    identify a second device based on the input from the camera, the second device comprising at least one speaker and at least one microphone;
    identify a current location of the second device within an environment based on the input from the camera;
    identify a current location of at least one object within the environment that is different from the second device; and
    provide a command to alter operation of one or more of the at least one speaker and the at least one microphone based on a determination that the second device is within a threshold non-zero distance to the at least one object;
    wherein the second device is identified as a conferencing device.

2. The first device of claim 1, wherein the command is transmitted to the second device for the second device to alter operation of one or more of the at least one speaker and the at least one microphone.

3. The first device of claim 1, wherein the current locations are identified using at least one computer vision algorithm.

4. The first device of claim 3, wherein the at least one computer vision algorithm employs augmented reality (AR) processing.

5. The first device of claim 4, wherein the AR processing is employed to mimic sound waves as emanating from the second device and striking the at least one object, with identification of the sound waves striking the at least one object being used to provide the command.

6. The first device of claim 5, wherein the instructions are executable by the at least one processor to:
    identify the current location of the at least one object responsive to the identification of the sound waves striking the at least one object.

7. The first device of claim 1, wherein the first device comprises a server.

8. The first device of claim 1, wherein the first device comprises one or more of: a headset, a tablet computer, a smart phone.

9. The first device of claim 1, wherein the at least one microphone comprises first and second microphones, and wherein the command indicates that the first microphone is to be deactivated, the first microphone being oriented toward the at least one object.

10. The first device of claim 1, wherein the at least one microphone comprises first and second microphones, and wherein the command indicates that the first microphone is to remain activated but have its sensitivity level reduced, the first microphone being oriented toward the at least one object.

11. The first device of claim 1, wherein the at least one speaker comprises first and second speakers, and wherein the command indicates that the first speaker is to be deactivated, the first speaker being oriented toward the at least one object.

12. The first device of claim 1, wherein the at least one speaker comprises first and second speakers, and wherein the command indicates that the first speaker is to remain activated but have its volume output level reduced, the first speaker being oriented toward the at least one object.

13. A method, comprising:
    receiving, at an apparatus, data related to a current location of a device and related to a current location of at least one object other than the device, the device at least comprising at least one speaker;
    using computer vision and the data to identify the current location of the device, the current location of the at least one object, and an orientation of a first speaker of the at least one speaker;
    using the current location of the device, the current location of the at least one object, and the orientation of the first speaker to identify that the first speaker is at least partially facing the at least one object; and
    altering, responsive to identifying that the first speaker is at least partially facing the at least one object, operation of the first speaker by either turning the first speaker off or reducing the first speaker's volume output level.

14. The method of claim 13, wherein the apparatus comprises one or more of: a headset, a server, the device.

15. At least one computer readable storage medium (CRSM) that is not a transitory signal, the computer readable storage medium comprising instructions executable by at least one processor to:
    receive camera input;
    based on the camera input, use computer vision to identify a current location of a device and to identify a current location of at least one object in relation to the current location of the device, the object being something other than the device, the device comprising at least one microphone; and
    provide a command to alter operation of the at least one microphone based on the use of computer vision, the command indicating that the at least one microphone should one or more of: be deactivated, remain active but have its sensitivity level reduced.

16. The CRSM of claim 15, wherein the computer vision comprises augmented reality (AR) processing, wherein the AR processing is used to mimic sound as emanating from at least one speaker on the device and impinging the at least one object, and wherein identification of the sound as impinging the at least one object is used to provide the command.

17. The CRSM of claim 15, wherein the command indicates that the at least one microphone should be deactivated.

18. The CRSM of claim 15, wherein the command indicates that the at least one microphone's sensitivity level should be reduced.

19. The CRSM of claim 15, wherein the at least one microphone is oriented toward the at least one object.

20. The first device of claim 1, comprising the camera.

* * * * *